United States Patent
Shou et al.

[11] Patent Number: 5,936,463
[45] Date of Patent: Aug. 10, 1999

[54] INVERTED AMPLIFYING CIRCUIT

[75] Inventors: Gouliang Shou; Takashi Tomatsu; Kazunori Motohashi, all of Tokyo, Japan

[73] Assignee: YOZAN Inc., Tokyo, Japan

[21] Appl. No.: 08/859,109

[22] Filed: May 20, 1997

[30] Foreign Application Priority Data

May 21, 1996 [JP] Japan ................................. 8-150018
Jul. 12, 1996 [JP] Japan ................................. 8-203273

[51] Int. Cl.$^6$ .............................................. H03F 1/34
[52] U.S. Cl. ................................ 330/9; 330/51; 330/107; 330/294; 327/562
[58] Field of Search ................................ 330/9, 51, 107, 330/264, 294; 327/112, 562

[56] References Cited

U.S. PATENT DOCUMENTS

| 4,446,444 | 5/1984 | Patterson . | |
|---|---|---|---|
| 5,424,973 | 6/1995 | Shou et al. . | |
| 5,465,064 | 11/1995 | Shou et al. . | |
| 5,604,458 | 2/1997 | Shou et al. . | |
| 5,745,010 | 4/1998 | Miyamoto et al. | 330/294 |

FOREIGN PATENT DOCUMENTS

| 584 544 A1 | 3/1994 | European Pat. Off. . |
|---|---|---|
| 6-45839 | 2/1994 | Japan . |
| 07094957 | 4/1995 | Japan . |
| 2 080 649 | 2/1982 | United Kingdom . |

OTHER PUBLICATIONS

M. Krauss, "Entwurf und Realisierung Eines Integrieten Operationsverstarkers in Enhancement/Depletion–MOS–Technik", Nachrichten Technik Electronik, vol. 35, No. 9, 1985, Berlin DE, pp. 327–330.

Harald Parzhuber and Wolfgang Steinhagen, "An Adaptive Biasing One–Stage CMOS Operational Amplifier for Driving High Capacitive Loads", IEEE Journal of Solid–State Circuits, vol. 26, No. 10, Oct. 1991, pp. 1457–1460.

Richard A. Rikoski and Mario Dianora, "A Micropower Complementary–MOS d.c. amplifier", Internat'l Journal of Electronics, vol. 40, No. 3, Mar. 1976, London GB, pp. 237–240.

C. Azerdo Leme, T. Boltshauser and H. Baltes, "CMOS Absolute Value Precision Capacitance Measurement System", Internat'l Symposium on Circuits and Systems, May 10, 1992, Institute of Electrical and Electronics Engineers, pp. 1277–1279.

Primary Examiner—James B. Mullins
Attorney, Agent, or Firm—Pillsbury Madison & Sutro LLP

[57] ABSTRACT

An stable inverted amplifying circuit includes an odd number of CMOS inverters and a feedback capacitance. Balancing resistances decrease the inverter open gain and limit the gain of the entire circuit. Serial capacitances act to prevent low-frequency oscillation. Oscillation-preventing circuits are also provided to reduce high-frequency oscillation. Sleep, refresh, and sleep-refresh switches are used to cancel residual loads and reduce power consumption.

20 Claims, 13 Drawing Sheets

INVERTED AMPLIFYING CIRCUIT

FIELD OF THE INVENTION

The present invention relates to an inverted amplifying circuit including CMOS inverters serially connected in an odd number of stages and a feedback capacitance for feeding back the output of the last-stage CMOS inverter to the input of the first-stage CMOS inverter.

BACKGROUND OF THE INVENTION

The inventors of the present invention proposed an inverted amplifying circuit in Japanese Patent Laid-Open Publication No.7-94957 that used analog voltages to prevent unstable oscillation during computation and guarantee linearity characteristics.

Figure 5:
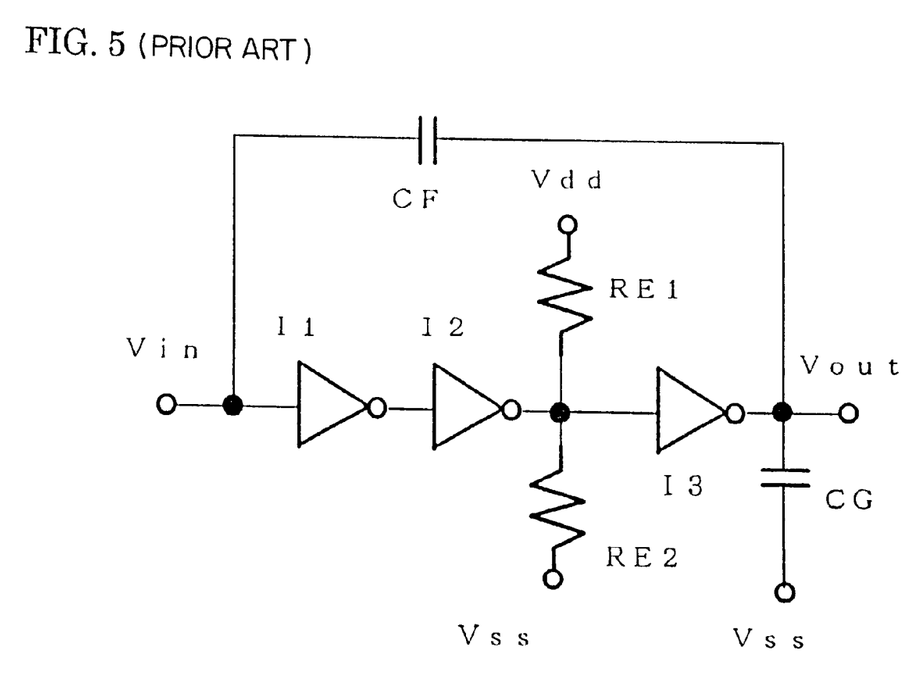
FIG. 5 shows a conventional inverted amplifying circuit.

FIG. 5 shows one of the circuits proposed in that reference. CMOS inverters I1, I2 and I3 in an odd number of stages are connected in series, and the output of last-stage CMOS inverter I3 is inputted to CMOS inverter I1 through feedback capacitance CF. In a circuit so structured, regardless of the load at any of the stages following I3, a voltage Vout equal to the inversion of input voltage Vin inputted to I1 is generated by the high gain of each CMOS inverter as an output of I3 with accuracy.

In the circuit in FIG. 5, a balancing resistance containing a pair of resistances RE1 and RE2 is connected to the output of CMOS inverter I2 at the stage immediately preceding the last one. RE1 and RE2 are connected to high-potential supply voltage Vdd and low-potential supply voltage Vss, respectively. Resistances RE1 and RE2 decrease the open gain of I2 and limit the gain of the entire inverted amplifying circuit.

The output of the last-stage CMOS inverter I3 is grounded through the low-pass capacitance CG. This inverted amplifying circuit has a decreased gain in the high-frequency area and an increased phase margin.

Phase margin and gain margin can be obtained as stated above, and oscillation can be prevented up to within the high-frequency area.

SUMMARY OF THE INVENTION

However, in the balancing resistance in the circuit in FIG. 5, a small electric current always passes from the high-potential point to the low-potential one. This effect is disadvantageous for reducing electric power consumption. As lowering the power consumption is a concern also with respect to a filter circuit requiringan inverted amplifying circuit, even such a minimal consumption increases its weight.

Though providing a sleep mode reduces electric power consumption, there was no such function in the prior art circuit.

The present invention solves the above problems and has an object to provide an inverted amplifying circuit enabling a balancing resistance to reduce power consumption with no sacrifice of stability, while simultaneously incorporating a sleep mode.

In an inverted amplifying circuit according to the present invention, the generation of low-frequency electric current is prevented by connecting capacitances to balancing resistances in series. Also, this inverted amplifying circuit works to prevent low-frequency electric current by connecting capacitances in series to the circuit to prevent oscillation, cuts off the feedback route of the feedback capacitance, and leads a CMOS inverter in the inverted amplifying portion to a cutoff or a saturation point.

BRIEF DESCRIPTION OF THE DRAWINGS

FIG. 9($a$) shows an example of the inverted amplifying circuit of the fourth embodiment.

FIG. 9($b$) shows another example of the inverted amplifying circuit.

PREFERRED EMBODIMENT OF THE PRESENT INVENTION

Hereinafter the first embodiment of an inverted amplifying circuit according to the present invention is described with reference to the attached drawings.

Figure 1:
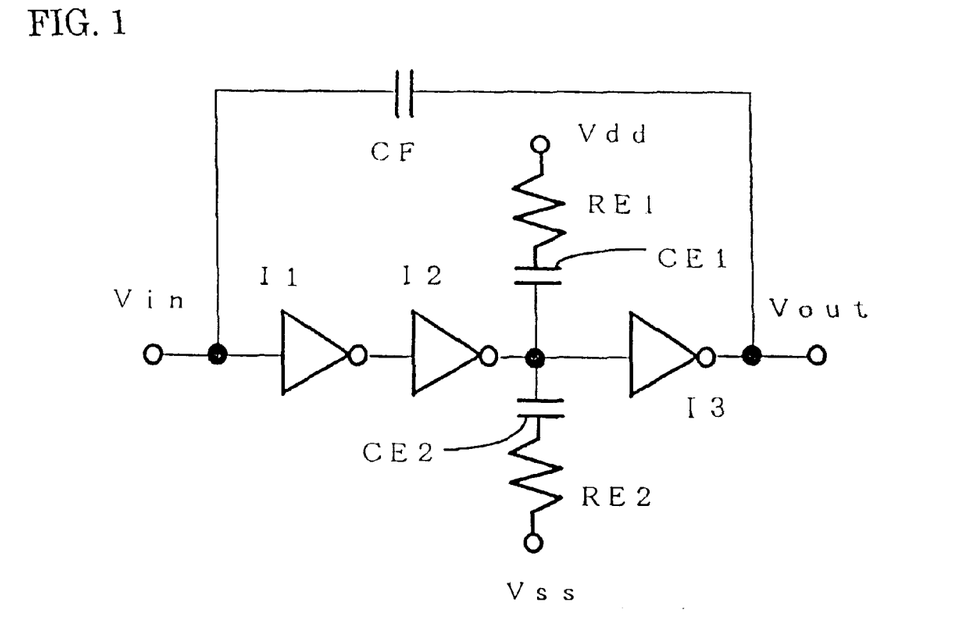
FIG. 1 shows the first embodiment of an inverted amplifying circuit according to the present invention.

In the inverted amplifying circuit in FIG. 1, similarly to the conventional one, CMOS inverters I1, I2 and I3 in an odd number of stages are connected in series, and the output of the last-stage CMOS inverter I3 is inputted to the first-stage CMOS inverter I1 through feedback capacitance CF.

To the output of CMOS inverter I2 at the stage previous to the last one, a balancing resistance containing a pair of resistances RE1 and RE2 is connected. Capacitances CE1 and CE2 are serially connected to RE1 and RE2, respectively. That is, one series circuit consisting of RE1 and CE1 is provided between the output of I2 and Vdd, and another consisting of RE2 and CE2 is provided between the output of I2 and Vss. These series circuits decrease the open gain of I2 and restrain the gain of the entire inverted amplifying circuit. Impedance against low-frequency electric current is high, and electric power consumption is much lower than that of conventional circuits.

Any positional relationship between resistances RE1 and RE2 and capacitances CE1 and CE2 can be adopted. Resistances can be placed closer or farther to the supply voltage than capacitances as in FIGS. 1 and 2. Either will do.

The balancing resistance need not necessarily be connected to the output of I2; it can be connected to the output of I1 instead. Generally, good results ensue from connecting it to the CMOS inverter one stage prior to the final one.

Figure 2:
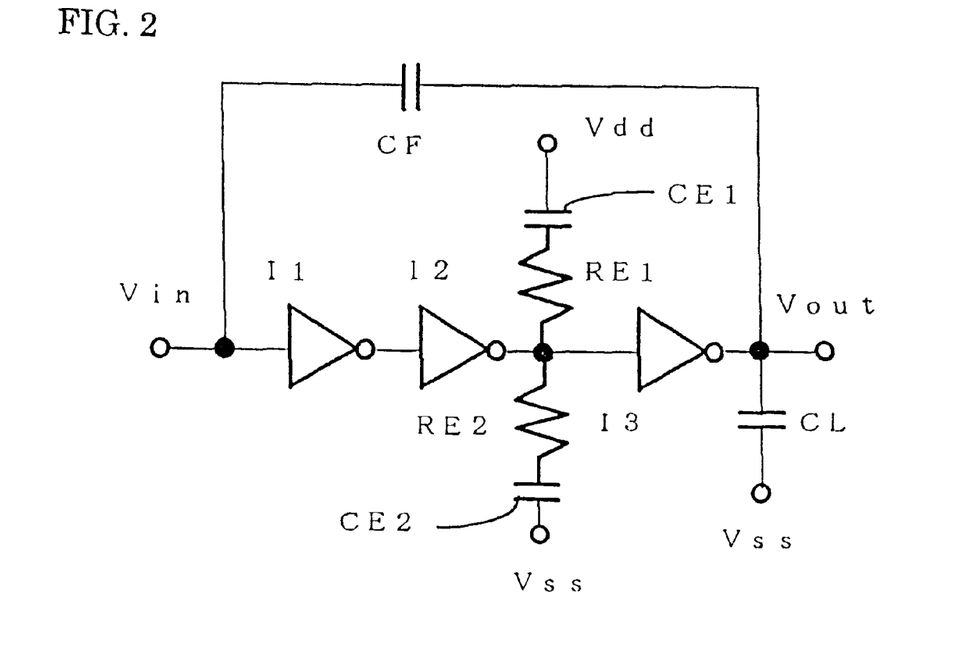
FIG. 2 shows a variation of the first embodiment.

FIG. 2 shows a variation that uses the grounded capacitance CL, as in the conventional embodiment, to prevent oscillation more effectively. Connecting the balancing resistance to the output of I1 also gives good oscillation prevention results.

Another effective structure results from connecting only one high- or low-potential RC circuit at its balancing resistance to one or both of the outputs of I1 and I2, and further to connect a high-potential series circuit to one of them and a low-potential series circuit to the other.

Figure 3:
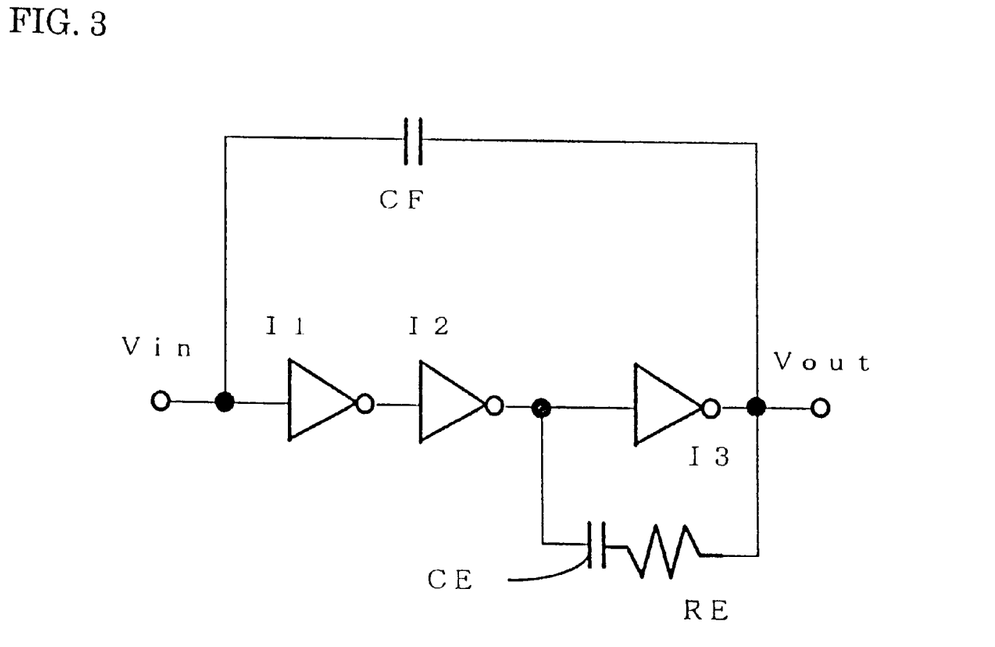
FIG. 3 shows the second embodiment of the present invention.

FIG. 3 shows the second embodiment. Between the input and output of the last-stage CMOS inverter I3, a series circuit consisting of resistance RE and capacitance CE is provided instead of the balancing resistance as in the circuits in FIGS. 1 and 2. As the series circuit is a negative feedback line of, and becomes a load of, I3, the gain of the inverted amplifying circuit is restrained similarly as in the above circuits by decreasing the gain of I3. Since there are fewer components in the present embodiment than in those of the circuits in FIGS. 1 and 2, the size and area of this circuit are smaller. Resistance RE and capacitance CE can be placed inversely. Good oscillation prevention results can be obtained by placing the series circuit between the input and output of I2.

Figure 4:
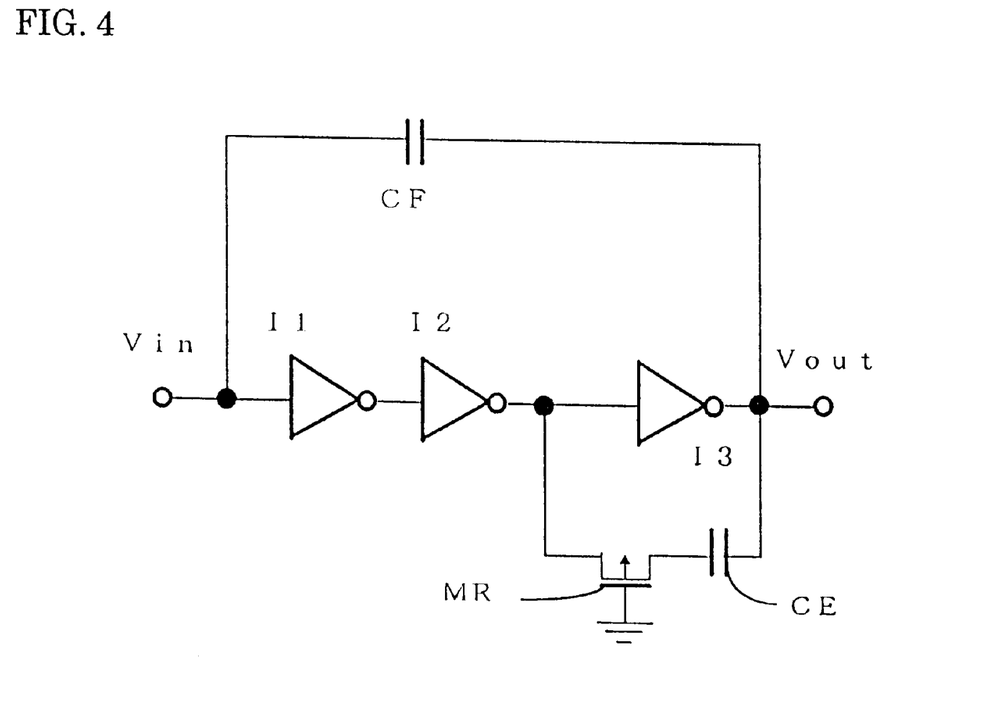
FIG. 4 shows the third embodiment of the present invention.

FIG. 4 shows the third embodiment of the present invention. By using MOS resistance MR instead of resistance RE as in FIG. 3, the size and area of the circuit further decrease. A series circuit may also be provided between the input and output of I2 in this embodiment. In FIG. 4, a pMOS device is used as a MOS resistance, but an nMOS device may also be used.

Now the cut-off frequency of the first embodiment is analyzed. Assuming the cut-off frequency is f0, equations (1) to (4) are true:

$$f_0 = g(A_r A_0^2 + 2)/[2\pi(2 \cdot CG \cdot CF)] \quad (1)$$

$$A_0 = g_m/g \quad (2)$$

$$A_r = g_m/(g + g_r) \quad (3)$$

g: a reciprocal number of a resistance of an output of an inverter $g_m$: a conductance of a CMOS inverter $g_r$: a reciprocal number of an impedance of one RC circuit containing RE1 and CE1 and another containing RE2 and CE2

CG: a capacity of a grounded capacitance CG

CF: a capacity of a feedback capacitance

Assuming that RE=1=RE2=re, CRE1=CE2=ce and an action element of the Laplace transform is s, $g_r$ is expressed as in formula (4):

$$g_r = 1/[re + (1/[ce \cdot s])] \quad (4)$$

In formula (4), as (ce·s) becomes small in the low-frequency area, $g_r$ becomes small and $A_r$ in formula (3) accordingly becomes large. Consequently, the cut-off frequency f0 in formula (1) is large. On the other hand, in the high-frequency area as (ce·s) becomes large and $g_r$ is large, the gain in the inverted amplifying circuit decreases. Oscillation in the high-frequency area is thereby prevented. That is, by adding a capacitance, not only is the electric power consumption reduced, but also the cut-off frequency increases.

Table 1 compares the embodiments in FIGS. 2 to 4 with the conventional circuit in FIG. 5. Area ratios are shown with that of the conventional circuit assumed to be 1. Electric power consumption A is the result of the AC analysis of the sinusoidal wave input, and electric power consumption B is the result of the transient analysis by rectangular waves.

TABLE 1

| Circuit | Cut-off Frequency (MHz) | Phase Margin (deg) | Electric Power Consumption A ($\mu$W) | Electric Power Consumption B ($\mu$W) | Area Ratio |
|---|---|---|---|---|---|
| FIG. 2 | 120 | 50 | 47.0 | 95.0 | 1.20 |
| FIG. 3 | 700 | 75 | 47.0 | 95.0 | 0.80 |
| FIG. 4 | 300 | 80 | 47.0 | 95.0 | 0.65 |
| Conventional Example (FIG. 5) | 100 | 40 | 228.2 | 250.0 | 1 (Referential Value) |

As is clear from Table 1, all embodiments of the present invention are superior to the conventional circuit with respect to electric power consumption and frequency. Moreover, the circuit areas of the second and the third embodiments in FIGS. 3 and 4 are smaller than the conventional one.

The so-called analog switch type resistance in which nMOS and pMOS devices are connected in parallel may be used instead of the MOS resistance in the embodiment in FIG. 4. Thus, dependence on the resistance voltage can be reduced and constant characteristics maintained regardless of input voltage. A predetermined positive, negative, or zero supply voltage or ground can be used.

Figure 6:
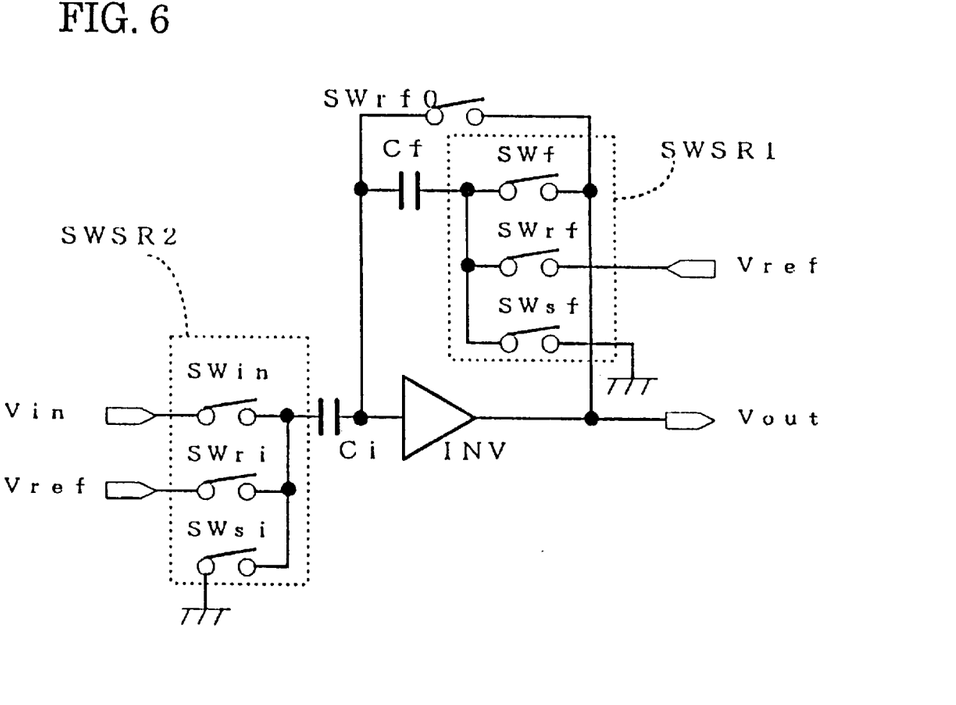
FIG. 6 shows the fourth embodiment of an inverted amplifying circuit.

FIG. 6 shows the fourth embodiment of an inverted amplifying circuit. In this inverted amplifying circuit, input voltage Vin is connected to input capacitance Ci, which is connected to input terminals of both odd number of stages of serial CMOS inverter INV and feedback capacitance Cf. The first sleep-refresh switch SWSR1 is connected to the output of Cf. Cf is connected to one of these three by SWSR1: the output terminal of INV, the reference voltage Vref, or the ground. Vref is the reference voltage of the range of output voltage of INV, usually half of the supply voltage Vdd. SWSR1 consists of switches SWf, SWrf and SWsf, which are connected respectively to the output of INV, Vref and the ground, and are selectively closed.

To the input of input capacitance Ci, the second sleep-refresh switch SWSR2 is connected. Ci is selectively connected to input voltage Vin, reference voltage Vref, or the ground by SWSR2, which consists of switches SWin, SWri and SWsi connected to input voltage Vin, Vref and the ground, respectively. These switches are selectively closed.

Refresh switch SWrf0 is connected between the input and output of INV. It is opened and closed by working with SWri in SWSR2 and SWrf in SWSR1 to cancel and refresh the residual charges of Ci and Cf.

Figure 9:
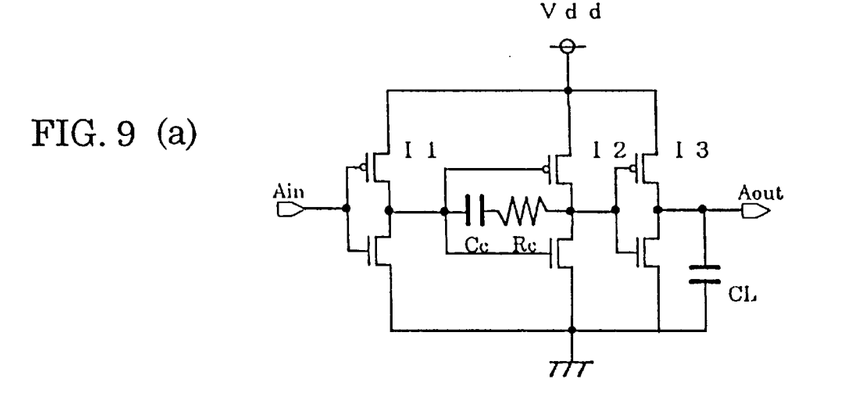

When SWin and SWf are opened and SWsi and SWsf are closed, INV becomes an inverter circuit, and each CMOS device operates at its cutoff point. Therefore, the electric power consumption of each CMOS device can be ignored. Also, when an input of INV is connected to the supply voltage and each CMOS device functions at its saturation point, no electric current is generated. As shown in FIGS. 9(a) and 9(b), a conventional balancing resistance is not provided in the inverted amplifying portion INV. Therefore, no electric current is generated in the balancing resistance, and electric power consumption is reduced.

In the circuit of FIG. 9(a), high-frequency components are reduced by connecting grounded capacitance CL to each output of the last three stages of serial CMOS inverters I1, I2 and I3. A series circuit including resistance Rc and capacitance Cc is connected between the input and output of the second-stage CMOS inverter. As the series circuit is a negative feedback line and load of I2, the gain of the inverted amplifying circuit is controlled by decreasing the gain of I2. The result is a circuit for preventing unstable oscillation without generation of electric current in which any order of Rc and Cc can be adopted.

The inverted amplifying portion in FIG. 9(b) utilizes MOS resistance Mc instead of resistance Rc as in FIG. 9(a). The size and area of the circuit can be further reduced. Although a pMOS device is used as the MOS resistance in FIG. 9(b), an nMOS device may also be used.

Figure 10:
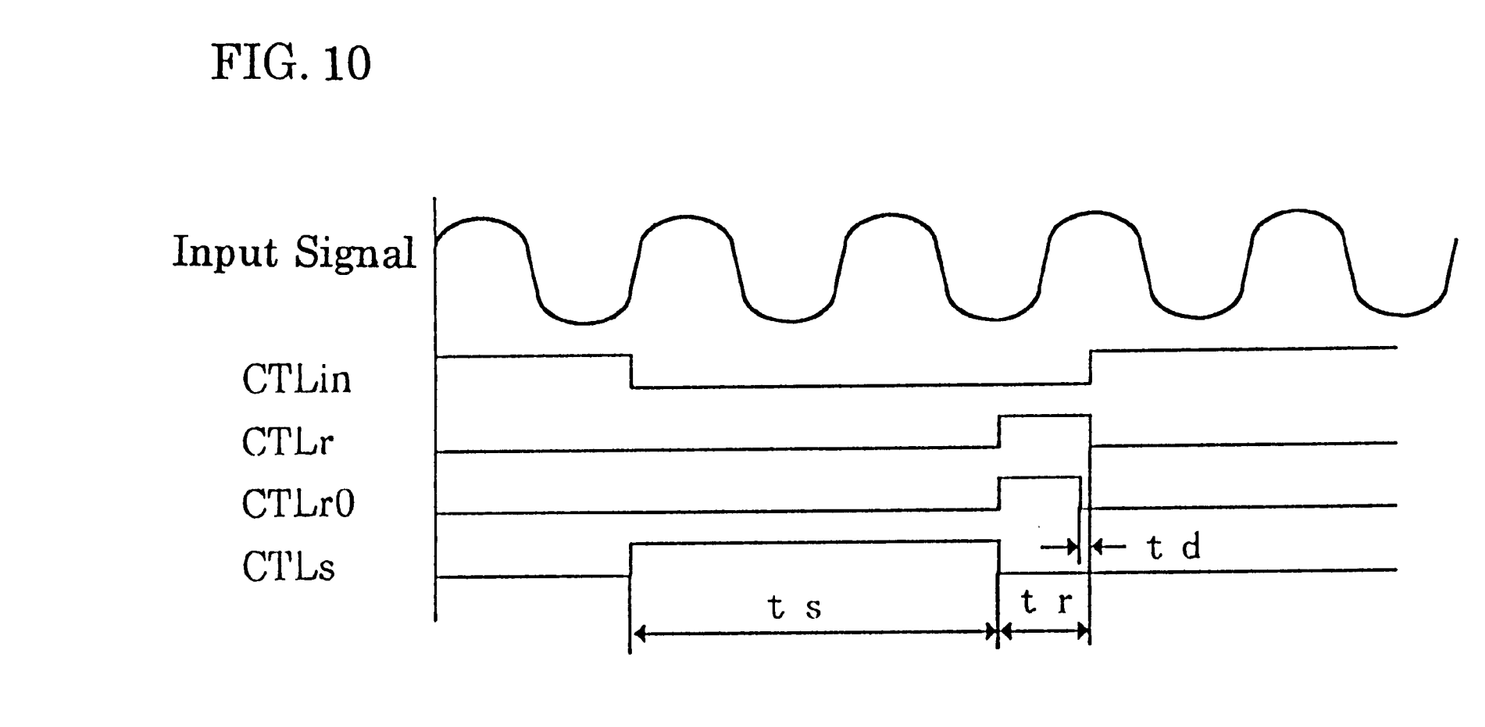
FIG. 10 shows a timing chart of the fourth embodiment.

FIG. 10 is a timing chart of this embodiment showing the timings of input signal Vin and control signals CTSin, CTLr, CTLr0 and CTLs. CTLin controls the opening and closing of switches SWin and SWf for usual work: they are closed when the signal is high-level and open when low-level. CTLr0 similarly controls switch SWrf0 for refreshing: it is closed when the signal is high-level and open when low-level. Likewise, CTLs controls switches SWsi and SWsf for the sleep mode: they are closed when the signal is high-level and open when low-level.

ts and tr show the sleep mode and refresh periods, respectively. Other periods show usual work. A refresh period is set before usual work because the residual load has to be canceled when usual work is started. When the refreshing ends, SWrf0 is opened slightly later than switches SWri and SWfr. FIGS. 11 to 14 show the effectiveness of the delay times.

Figure 11:
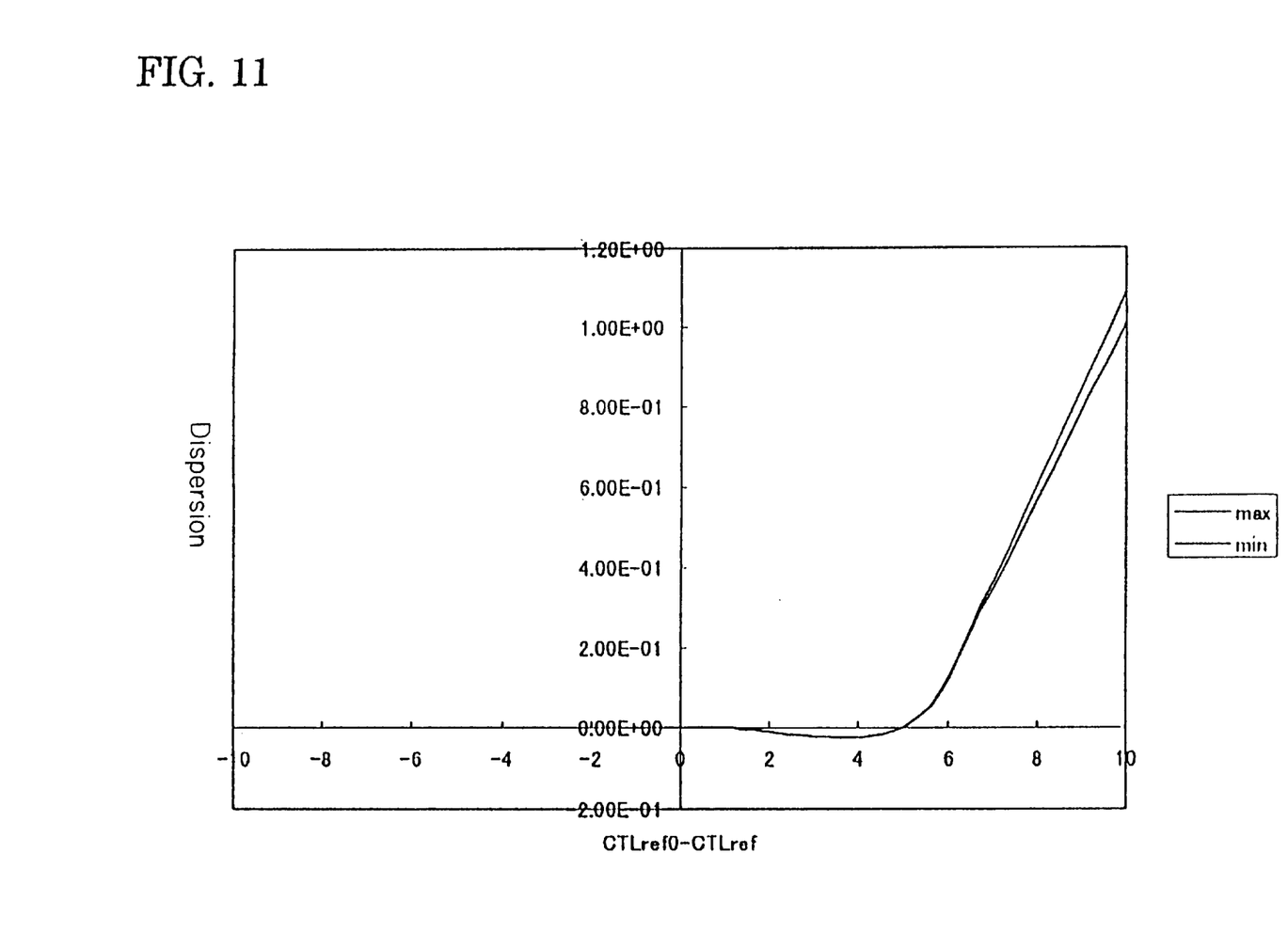
FIG. 11 is a graph showing the relationship between the refresh time in FIG. 10 and output accuracy.
Figure 12:
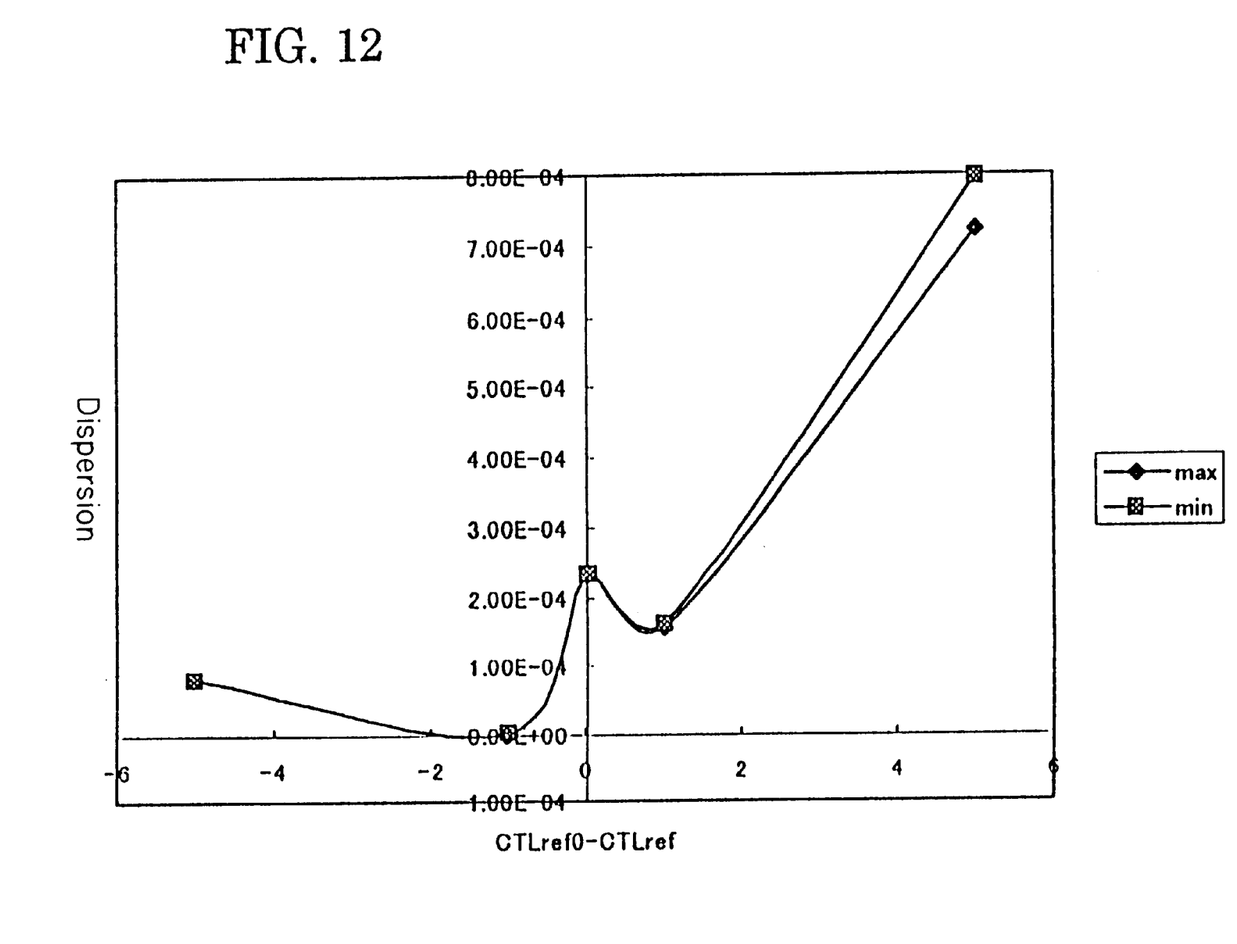
FIG. 12 is a graph showing the output accuracy in FIG. 11.

FIG. 11 shows the relationship between delay time -td and output voltage dispersion, assuming that input voltage Vin is 1.5V on average, amplitude is 1.0V and frequency is 1.3 MHz. The vertical axis shows linearity graduation: dispersion decreases when td<0 compared to the case of td>0. The delay effect is clear, and FIG. 12 shows the same data in FIG. 11: dispersion is minimal when delay time td is around 1 nsec.

Figure 13:
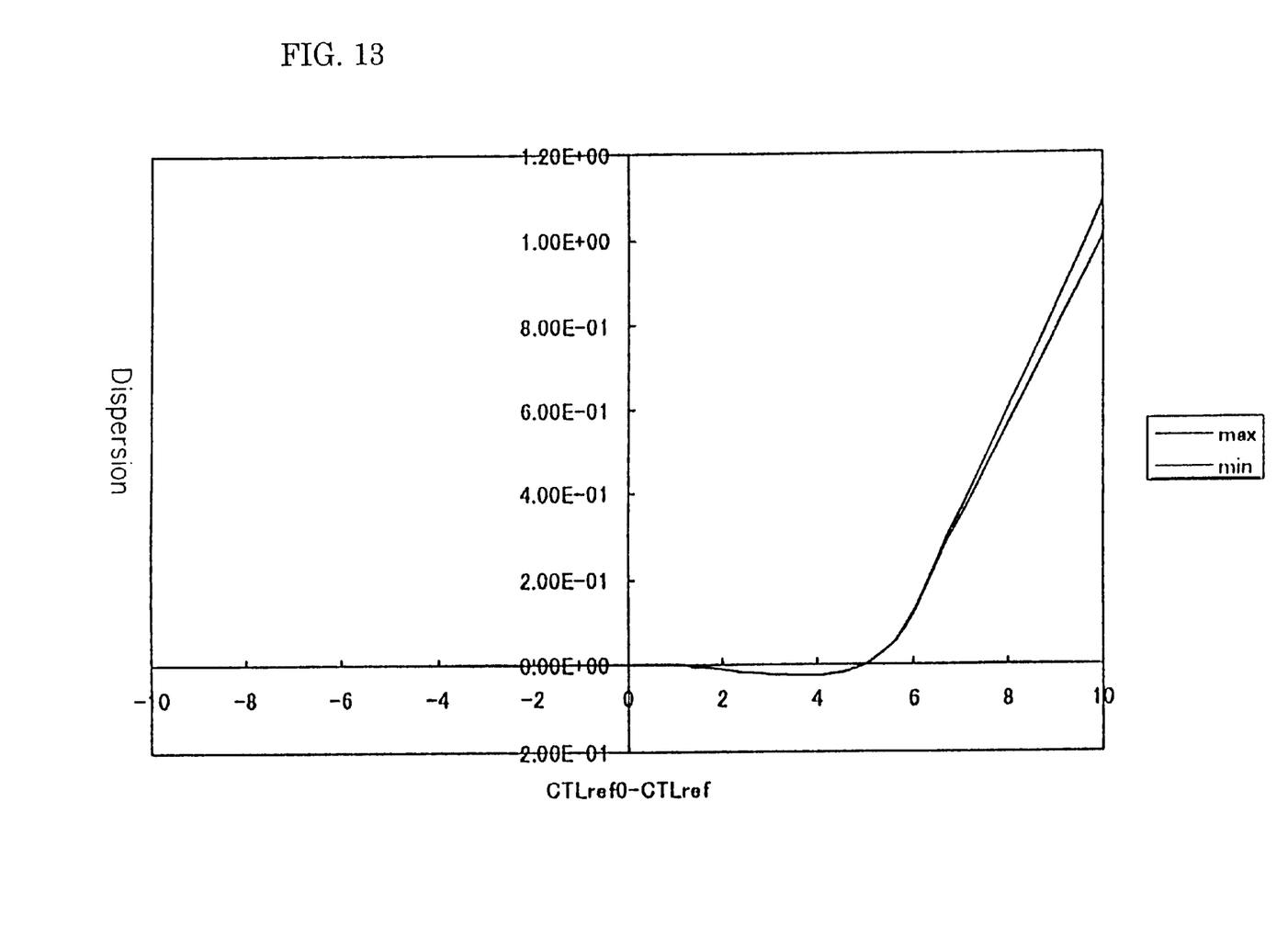
FIG. 13 is a graph showing the relationship between the refresh time in another input condition and output accuracy.
Figure 14:
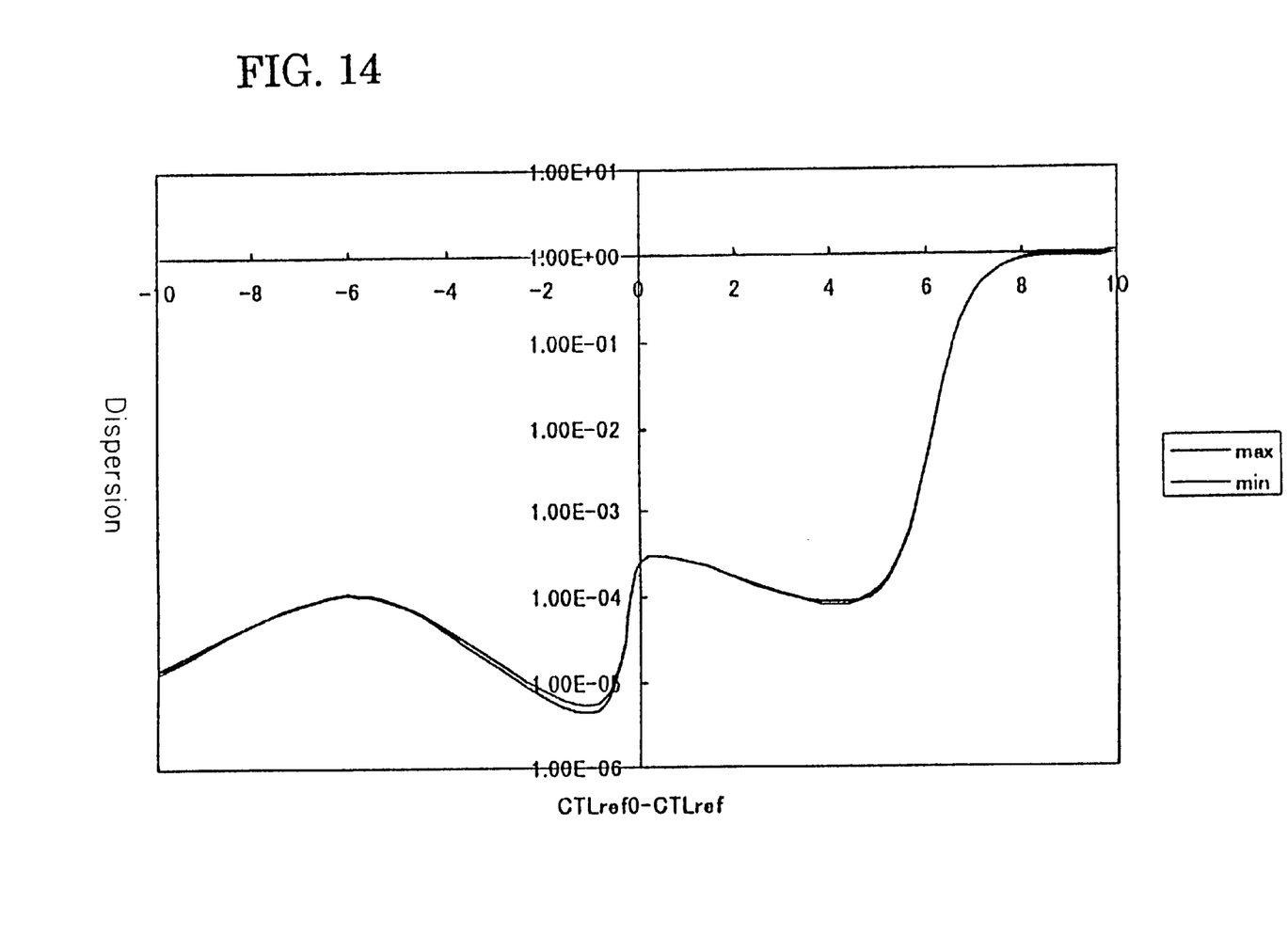
FIG. 14 is a graph showing the output accuracy in FIG. 13 on a logarithmic scale.

FIG. 13 shows the relationship between the delay time -td and output Vout dispersion, given that Vin is 1.5V on average, amplitude is 0.5V and frequency is 1.3 MHz. The horizontal axis shows negative delay time, and the vertical axis shows linearity graduation: dispersion is minimal when delay time td is around 1 nsec, similar to FIG. 12.

Figure 7:
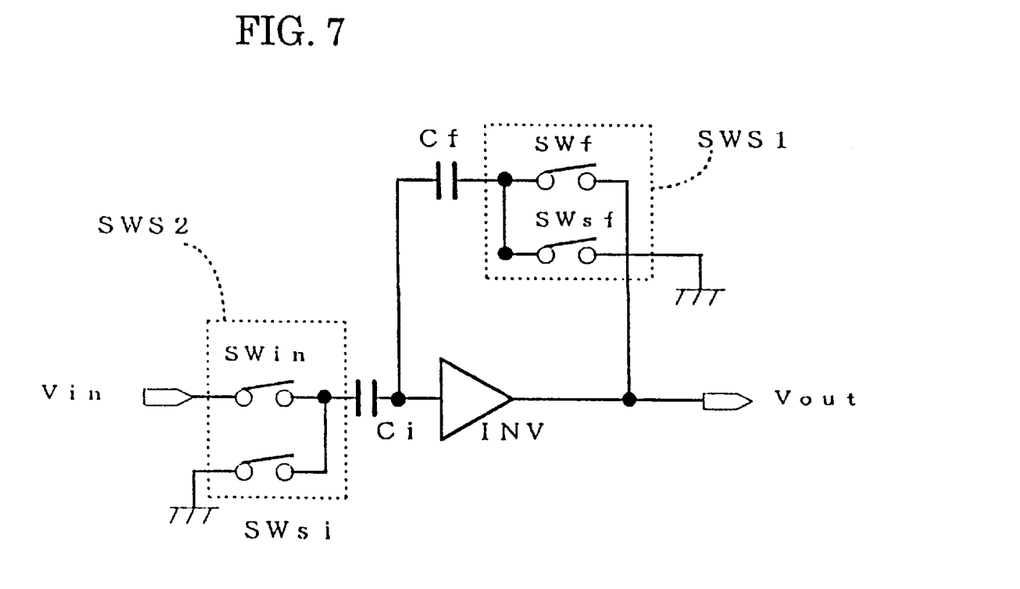
FIG. 7 shows the fifth embodiment.

FIG. 7 shows the fifth embodiment of the present invention. The refresh function is omitted by adopting first and second sleep switches SWS1 and SWS2 instead of first and second sleep-refresh switches SWSR1 and SWSR2 as in FIG. 6. Such a simplified structure is effective when the allowable output accuracy is low.

Figure 8:
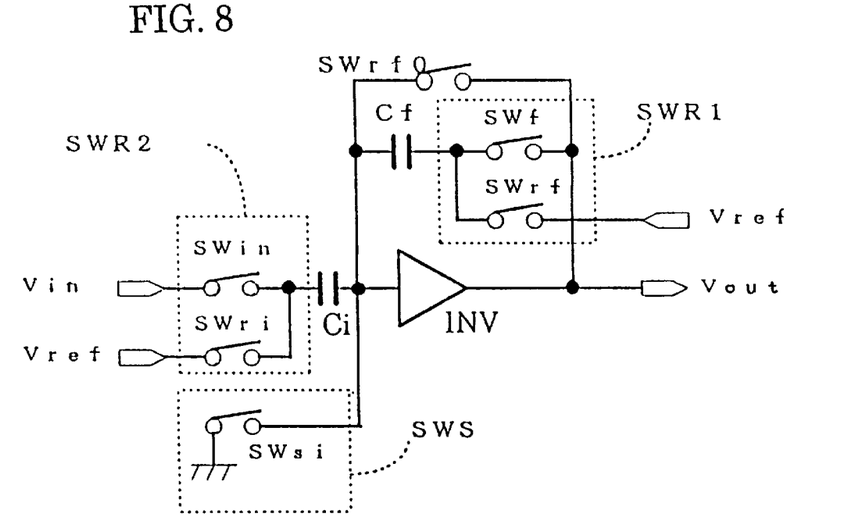
FIG. 8 shows the sixth embodiment.

FIG. 8 shows the sixth embodiment of the present invention. SWsi in SWSR2 of FIG. 6 is independent as a sleep switch and directly connected to the input of INV. The second refresh switch SWR2 including SWin and SWri is connected to input capacitance Ci. The first refresh switch SWR1 is set instead of SWSR1 in FIG. 6, omitting SWsf in SWSR1. When SWf and SWrf0 are opened, electric power consumption is reduced by inputting INV to the ground and designating INV the cutoff point. The circuit structure of this embodiment is simpler than that of the fourth embodiment, and the refresh function omitted from the fifth embodiment can be implemented. In the structures in FIGS. 7 and 8, a supply voltage can be connected instead of the ground potential in the sleep mode.

Figure 15:
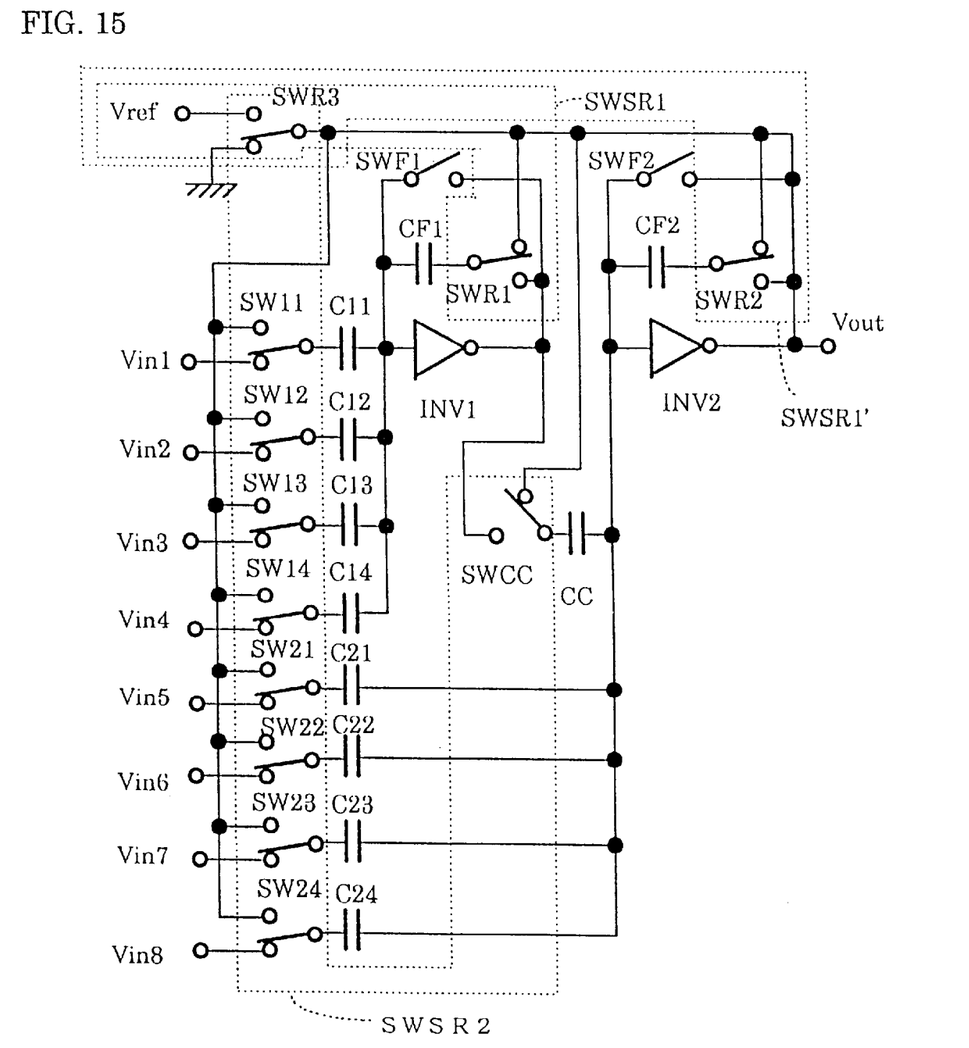
FIG. 15 shows the fourth embodiment of the present invention.

FIG. 15 shows the embodiment in which two stages of inverted amplifying circuits are serially connected to perform signed addition. In FIG. 15, a plurality of input voltages Vin1 to Vin8 are connected to parallel capacitances C11 to C14 and C21 to C24. C11 to C14 perform addition of Vin1 to Vin4, and C21 to C24 perform addition of Vin5 to Vin8 as capacitative couplings.

C11 to C14 correspond to the input capacitances, and their outputs are inputted to inverted amplifying portion INV1. To the outputs of C11 to C14, feedback capacitance CF1 is connected parallel to INV1. To the output of CF1, first sleep-refresh switch SWSR1 is connected. By SWSR1, the output of CF1 is connected to the output of INV1, the reference voltage Vref, or the ground. To the inputs of capacitances C11 to C14 and C21 to C24, second sleep-refresh switch SWSR2 is connected. The capacitances are connected to the corresponding input voltage, the reference voltage, or the ground. C21 to C24 also correspond to the input capacitance, and their outputs are inputted to inverted amplifying portion INV2. To the outputs of C21 to C24, feedback capacitance CF2 is connected in parallel to INV2. The output of CF2 is connected to third sleep-refresh switch SWSR1', which consists of parts identical to those of SWSR1. By SWSR1', the output of CF2 is connected to an output of INV2, the reference voltage Vref, or the ground.

SWSR1 consists of switch SWR1 to connect an output of CF1 to an output of INV1 or switch SWR3. SWR3 connects an output of SWR1 to Vref or the ground. The third sleep-refresh switch SWSR1' consists of switch SWR2 to connect the output of CF2 to the output of INV2 or switch SWR3. The second sleep-refresh switch SWSR2 consists of switches SW11 to SW14 and SW21 to SW24 to connect the input of each capacitance to the input voltage or switch SWR3. SWR3 is used in common with the sleep-refresh switch above. To INV1 and INV2, refresh switches SWF1 and SWF2 corresponding to SWrf in FIG. 6 are respectively connected.

As above, the circuit structure can be simplified as a whole by one common switch to connect an input or output to Vref and the ground.

The output of INV1 is connected to INV2 in parallel to the output of C21 to C24 through intermediate capacitance CC, and the signed accumulations below are performed.

Assuming that offset voltages of INV1 and INV2 are respectively Vb1 and Vb2, the output voltage of INV1 is Va, C11 to C14 and C21 to C24 are respectively represented by C1i and C2i, and Vin1 to Vin8 are represented by Vin(i), the equations in (5) and (6) are true according to the principle of the conservation of energy:

$$CF1(Va-Vb1)+\Sigma_{i=1}^{i=4}C1i\cdot\{Vin(i)-Vb1\}=0 \quad (5)$$

$$CF2(Vout-Vb2)+CC(Va-Vb2)+\Sigma_{i=5}^{i=8}\{Vin(i)-Vb2\}=0 \quad (6)$$

Generally, as Vb1=Vb2, representing Vb1 and Vb2 by Vb, and assuming that CF1=CF2=CC and representing CF1, CF2 and CC by CF, formula (7) is derived:

$$(Vout-Vb)=\Sigma_{i=1}^{i=4}C1i\cdot\{Vin(i)-Vb\}-\Sigma_{i=5}^{i=8}C2i\cdot\{Vin(i)-Vb\} \quad (7)$$

Formula (7) demonstrates how the weighted accumulation result of Vin5 to Vin8 is subtracted from that of Vin1 to Vin4.

INV1 is connected to intermediate capacitance CC through intermediate switch SWCC. SWCC connects the input terminal of CC to INV1 or SWR3. By such connections, the input of INV2 is connected to the ground through SWCC and SWR3 when it is in the sleep mode, and is connected to the reference voltage when in the refresh mode. Both refresh and sleep modes can be completely realized with respect to INV2. As SWCC is connected to the input of inverted amplifying portion INV2, it works synchronously to second sleep-refresh switch SWSR2 and can thus be included in SWSR2.

Figure 17:
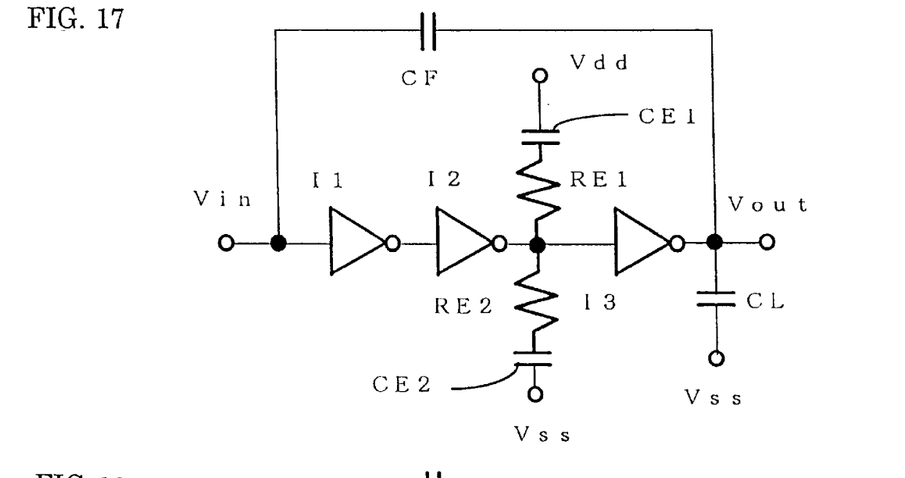
FIG. 17 shows an embodiment other than those of FIGS. 6, 7, 8, 15 and 16.

FIG. 17 shows another embodiment of the inverted amplifying portion, wherein a balancing resistance consisting of a pair of resistances RE1 and RE2 is connected to an output of CMOS inverter I2 at the stage immediately preceding the last stage. Capacitances CE1 and CE2 are serially connected to RE1 and RE2, respectively. That is, a serial circuit including RE1 and CRE1 is connected between the output of I2 and Vdd, and another serial circuit including RE2 and CE2 is connected between the output of I2 and Vss. Although these serial circuits decrease the open gain of I2 and limit the gain of the entire inverted amplifying circuit, impedance against low-frequency current is high, and electric power consumption is much lower than that of a conventional circuit.

Figure 16:
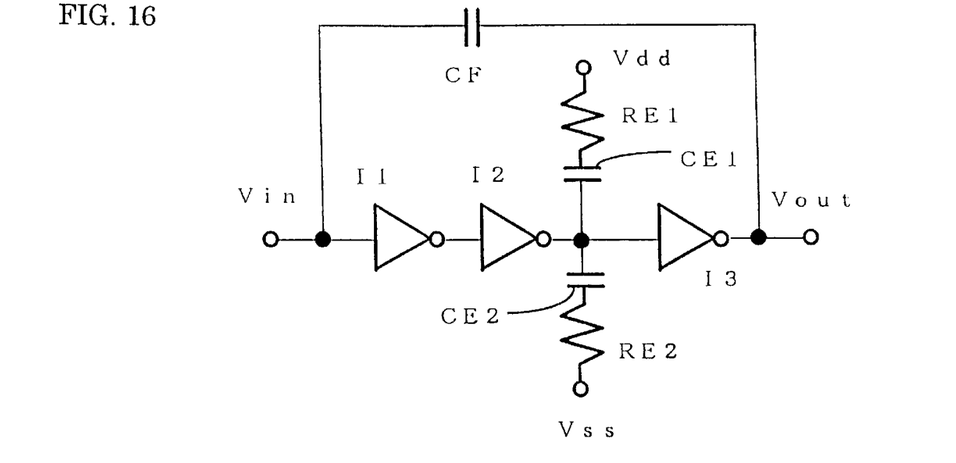
FIG. 16 shows another embodiment of the present invention.

Any positional relationship between resistances RE1 and RE2 and capacitances CE1 and CE2 can be adopted. Resistances can be placed closer to or farther from the supply voltage than capacitances as in FIGS. 16 and 17.

The balancing resistance need not necessarily be connected to the output of I2; it can be connected to the output of I1. Generally, good results ensue from connecting it to the CMOS inverter one stage prior to the final one.

Figure 18:
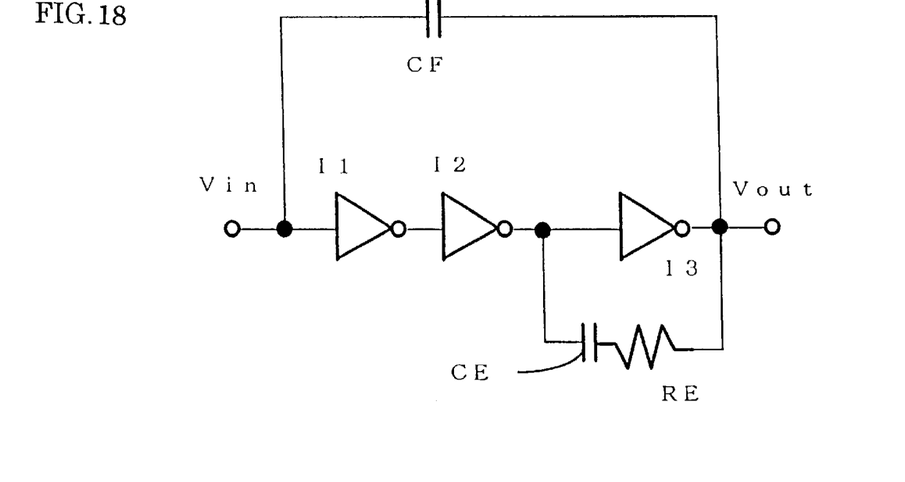
FIG. 18 shows an embodiment other than those of FIGS. 6, 7, 8, 15, 16 and 17.

The inverted amplifying portion in FIG. 18 shows a variation of that in FIG. 9(a). In FIG. 18, a serial circuit including resistance RE and capacitance CE is connected between the input and output of the last-stage CMOS inverter I3. As this serial circuit is a negative feedback line of I3 and a load of I3, it decreases the gain of I3 and limits the gain of the inverted amplifying circuit. The circuit in FIG. 9(a) has the advantage of receiving no influence from any capacitance component at the following stages, when compared with the present circuit.

Figure 19:
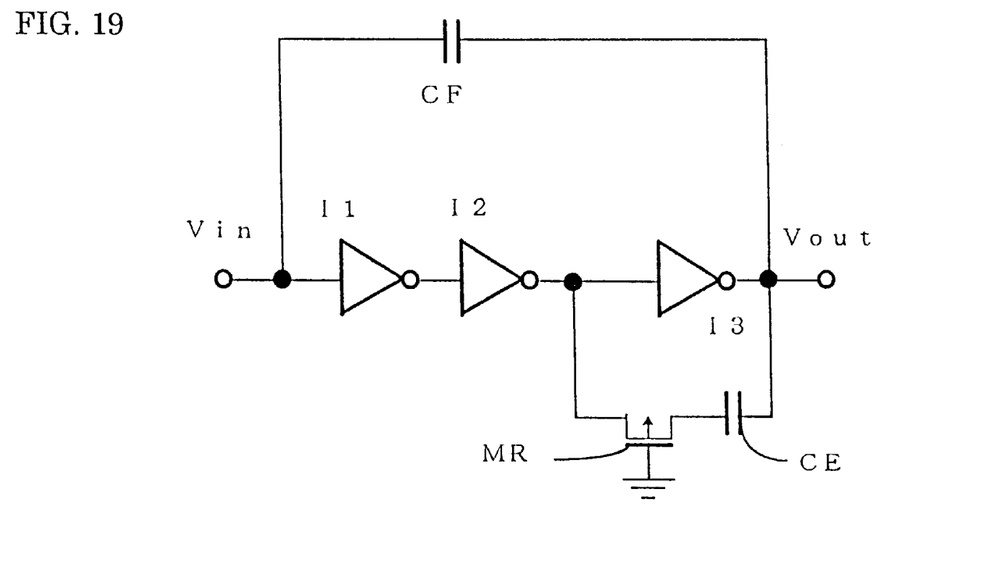
FIG. 19 shows an embodiment other than those of FIGS. 6, 7, 8, 15, 16, 17 and 18.

FIG. 19 shows a circuit of reduced size and area in which the serial circuit of MOS resistance MR capacitance in FIG. 9(b) is connected between an input and output of the last stage CMOS inverter. Like the case in FIG. 18 above, the circuit in FIG. 9(b) is superior to the present one because it receives no influence from the circuit at any following stage.

Figure 20:
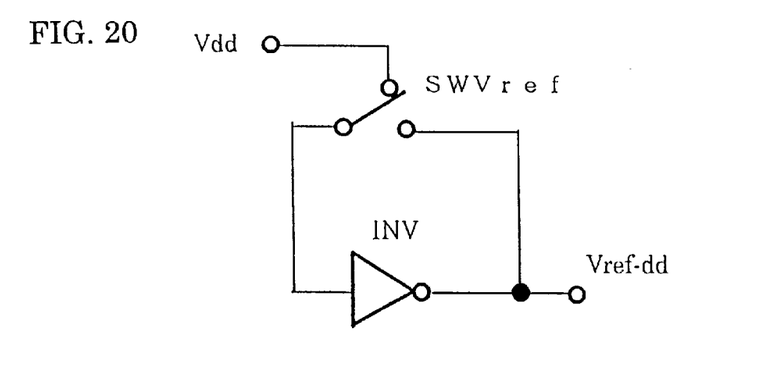
FIG. 20 shows a reference-voltage generating circuit.

FIG. 20 shows a reference-voltage generating circuit to generate Vref with a structure enabling connection to supply voltage in the sleep mode. The circuit includes inverted amplifying portion INV consisting of CMOS inverters serially connected in an odd number of stages, similar to INV1 and INV2 in FIG. 15. The output of INV is connected to its input through switch SWVref, which either connects the input to the output or to the supply voltage Vdd. When the INV input is connected to its output, input and output are balanced and converged in the voltage approximately Vdd/2. When it is connected to Vdd, the grounded voltage (0V) is generated as the inversion of Vdd at the output of INV. Therefore, Vref−dd of the reference-voltage generating circuit output is the reference voltage Vref or 0V. When this circuit is used instead of SWR3 in FIG. 15, the function of SWR3 can be included in the reference-voltage generating circuit.

According to the present invention, it is possible to reduce electric power consumption by a balancing resistance without inhibiting the stability of the inverted amplifying circuit, because a capacitance is connected to a balancing resistance in series and the generation of low-frequency electric current is arrested. In the present invention, low-frequency current is arrested by serially connecting capacitance to a circuit to prevent oscillation, the feedback route of a feedback capacitance is cut off, and a CMOS inverter is led to the cutoff point by connecting an input capacitance and a feedback capacitance to the ground. Therefore, it is feasible to reduce the circuit's electric power consumption, thus preventing oscillation, and to realize a sleep mode without inhibiting the circuit's stability.

What is claimed is:

1. An inverted amplifying circuit comprising:
   i) an odd number of stages of CMOS inverters, said stages being connected in series;
   ii) a feedback capacitance for feeding back an output of a last of said stages to an input of a first of said stages; and
   iii) a balancing network comprising a pair of series circuits connected to an output of one of said stages other than said last stage, each of said series circuits including a resistance and a capacitance.

2. An inverted amplifying circuit as claimed in claim 1, wherein each said capacitance is connected closer to a circuit supply voltage than a corresponding said resistance.

3. An inverted amplifying circuit as claimed in claim 1, wherein said balancing network is connected to one of said stages just before said last stage.

4. An inverted amplifying circuit comprising:
   i) an inverted amplifying portion including an odd number of stages of CMOS inverters, said stages being connected in series;
   ii) a feedback capacitance, one terminal being connected to an input of a first of said stages;
   iii) an input capacitance connected to said input of said first stage;
   iv) a first sleep switch for connecting another terminal of said feedback capacitance to an output of a last of said stages or to a ground potential;
   v) a second sleep switch for connecting said input capacitance to an input voltage or to a ground potential; and
   vi) an oscillation-preventing series circuit including at least one capacitance connected to one of said stages just beyond said first stage.

5. An inverted amplifying circuit as claimed in claim 4 wherein:
   said oscillation-preventing circuit is a balancing resistance containing a pair of serial circuits each having a resistance and a capacitance and being connected to an output of one of said stages other than said first stage and said last stage, one of said circuits being connected to a high-potential supply voltage and the other to a low-potential supply voltage.

6. An inverted amplifying circuit as claimed in claim 4 wherein said oscillation-preventing circuit is a serial circuit, comprising a resistance and a capacitance, connected between an input and an output of one of said stages other than a first stage and a last stage.

7. An inverted amplifying circuit as claimed in claim 4 wherein said oscillation-preventing circuit is a serial circuit, comprising a resistance and a capacitance, connected between outputs of said last stage and one of said stages other than said last stage.

8. An inverted amplifying circuit as claimed in claim 7 wherein at least one of each said capacitance is connected closer to an input than a corresponding said resistance.

9. An inverted amplifying circuit comprising:
   i) an inverted amplifying portion comprising an odd number of stages of serial CMOS inverters;
   ii) a feedback capacitance having one terminal connected to an input of a first of said stages;
   iii) an input capacitance connected to said input of said first stage;
   iv) a first refresh switch for connecting another terminal of said feedback capacitance to an output of a last of said stages or a reference voltage;
   v) a second refresh switch for connecting said input capacitance to an input voltage or the reference voltage;
   vi) a third refresh switch for connecting an input and output of said inverted amplifying portion;
   vii) a sleep switch for connecting said input of said first stage to a ground potential; and
   viii) an oscillation-preventing series circuit including at least one capacitance connected to one of said stages just beyond said first stage.

10. An inverted amplifying circuit as claimed in claim 9 wherein said sleep switch is connected to the ground potential or a supply voltage when said inverted amplifying circuit is in the sleep mode.

11. An inverted amplifying circuit as claimed in claim 9 wherein said third refresh switch is opened earlier than when said first and second refresh switches change mode when refreshing is completed.

12. An inverted amplifying circuit as claimed in claim 9 wherein said third refresh switch is opened several nanoseconds earlier than when said first and second refresh switches change mode when refreshing is completed.

13. An inverted amplifying circuit comprising:
   i) an inverted amplifying portion comprising an odd number of stages of serial CMOS inverters;
   ii) a feedback capacitance having one terminal connected to an input of a first of said stages;
   iii) an input capacitance connected to said input of said first stage;
   iv) a first sleep-refresh switch for connecting another terminal of said feedback capacitance to an output of a last of said stages, a reference voltage or a ground potential;
   v) a second sleep-refresh switch for connecting said input capacitance to the reference voltage or the ground potential;
   vi) a refresh switch for connecting an input and an output of said inverted amplifying portion; and
   vii) an oscillation-preventing series circuit including at least one capacitance connected to a stage just beyond said first stage.

14. An inverted amplifying circuit as claimed in claim 13 wherein said first and second sleep-refresh switches are connected to (1) the reference voltage when said inverted amplifying circuit is being refreshed and to (2) the ground potential or a supply voltage when said inverted amplifying circuit is in the sleep mode; and
   wherein said refresh switch is closed only when refreshing is performed.

15. An inverted amplifying circuit as claimed in claim 13 wherein said refresh switch is opened earlier than when said first and second sleep-refresh switches change mode when refreshing is completed.

16. An inverted amplifying circuit as claimed in claim 13 wherein said refresh switch is opened several nanoseconds earlier than when said first and second sleep-refresh switches change mode when refreshing is completed.

17. An inverted amplifying circuit comprising:
   i) an odd number of stages of CMOS inverters, said stages being connected in series;
   ii) a feedback capacitance for feeding back an output of a last stage to an input of a first stage; and
   iii) a balancing resistance comprising a plurality of branches, each of said branches being connected to an output of one of said stages other than said last stage and including a resistance connected in series with a capacitance.

18. An inverted amplifying circuit as claimed in claim 17, each of said branches being connected to an output of one of said stages other than said first stage.

19. An inverted amplifying circuit as claimed in claim 17, ends of said branches that are not connected to an output of one of said stages other than said last stage being connected at least indirectly to circuit supply voltages.

20. An inverted amplifying circuit as claimed in claim 19, wherein in at least one of said branches said capacitance is connected closer to a circuit supply voltage than said resistance.

* * * * *